(12) United States Patent
Murata et al.

(10) Patent No.: US 7,759,722 B2
(45) Date of Patent: Jul. 20, 2010

(54) SEMICONDUCTOR DEVICE AND METHOD OF MANUFACTURING THE SAME

(75) Inventors: Tatsunori Murata, Chiyoda-ku (JP); Koyu Asai, Chiyoda-ku (JP); Hiroaki Iuchi, Itami (JP)

(73) Assignee: Renesas Technology Corp., Tokyo (JP)

( * ) Notice: Subject to any disclaimer, the term of this patent is extended or adjusted under 35 U.S.C. 154(b) by 326 days.

(21) Appl. No.: 11/765,703

(22) Filed: Jun. 20, 2007

(65) Prior Publication Data

US 2008/0014760 A1 Jan. 17, 2008

(30) Foreign Application Priority Data

Jul. 12, 2006 (JP) .............................. 2006-191358

(51) Int. Cl.
*H01L 29/788* (2006.01)
(52) U.S. Cl. .................. 257/315; 257/E21.68; 438/257
(58) Field of Classification Search ......... 438/257–267; 257/314–320, E29.3, E29.301, E21.179, 257/E21.422

See application file for complete search history.

(56) References Cited

U.S. PATENT DOCUMENTS 7,005,699 B2* 2/2006 Chen et al. .................. 257/315
7,312,123 B2* 12/2007 Fukumura et al. ............ 438/257
2008/0035985 A1* 2/2008 Shimizu et al. .............. 257/316

FOREIGN PATENT DOCUMENTS

JP 2-86146 3/1990
JP 2005-85903 3/2005

* cited by examiner

*Primary Examiner*—Brook Kebede
(74) *Attorney, Agent, or Firm*—Oblon, Spivak, McClelland, Maier & Neustadt, L.L.P.

(57) ABSTRACT

When microfabrication is done, a reliable semiconductor device is offered.

A semiconductor device has a semiconductor substrate which has a main front surface, a plurality of convex patterns formed on the main front surface of a semiconductor substrate so that each might have a floating gate and a control gate, a first insulating film formed so that the upper surface and the side surface of each of a plurality of convex patterns might be covered, and so that width might become large rather than the portion which covers the lower part side surface of a convex pattern in the portion which covers an upper part side surface, and a second insulating film that covers the upper surface and the side surface of the first insulating film so that the cavity between the adjacent convex patterns may be occluded. The position occluded by the second insulating film of a cavity is a position higher than the upper surface of a floating gate, and is a position lower than the upper surface of a control gate.

17 Claims, 15 Drawing Sheets

SEMICONDUCTOR DEVICE AND METHOD OF MANUFACTURING THE SAME

CROSS-REFERENCE TO RELATED APPLICATION

The present application claims priority from Japanese patent application No. 2006-191358 filed on Jul. 12, 2006, the content of which is hereby incorporated by reference into this application.

1. FIELD OF THE INVENTION

The present invention relates to a semiconductor device and its manufacturing method, and particularly relates to the semiconductor device which has a cavity part, and its manufacturing method.

2. DESCRIPTION OF THE BACKGROUND ART

A miniaturization and microfabrication of the semiconductor device are advanced from the former, and how to make it small without causing various trouble has been an important problem.

And in recent years, in order to solve the above-mentioned problem, the AG-AND (Assist Gate-AND) type flash memory provided with a plurality of Assist Gate's for forming an inversion layer in the main front surface side of a semiconductor substrate, a floating gate formed between these Assist Gate's, and a control gate formed on this floating gate is proposed (for example, refer to Patent Reference 1).

The manufacturing method of this AG-AND type flash memory is provided with the step which forms Assist Gate on the main front surface of a semiconductor substrate, the step which forms an insulating film so that this Assist Gate may be covered, the step which performs dry etching to this insulating film, and a sidewall is formed on the both side surfaces of Assist Gate, and exposes the main front surface of a semiconductor substrate located between sidewalls, the step which forms the tunnel insulating film of a floating gate growing up an insulating film on the main front surface of the semiconductor substrate located between these sidewalls, and the step which fills up the recess between these sidewalls with a conductive layer, and forms a floating gate.

However, in the structure of the above flash memories, it fills up with the insulating film between floating gates. For this reason, when microfabrication is advanced, the gap of floating gates becomes narrow and the capacity between floating gates increases. Hereby, when the charge quantity accumulated into the floating gate of the selected memory cell was changed on the occasion of read operation, there was a problem on which the threshold value voltage of the selected memory cell is changed of the so-called threshold value voltage Vth shift having occurred, and becoming easy to generate malfunction.

On the other hand, the technology of decreasing the capacity between wirings by forming a cavity (occluded cavity) between wirings rather than embedding an insulator thoroughly between wirings is proposed (for example, refer to Patent Reference 2).

In this Patent Reference 2, the structure which formed the cavity in the insulating film which separates a plurality of wirings formed on the semiconductor substrate is described. It is described that, after an insulating film which has a cavity between wirings so that a plurality of wirings may be covered is formed as the manufacturing method, flattening of the upper surface of the insulating film is done.

[Patent Reference 1] Japanese Unexamined Patent Publication No. 2005-085903
[Patent Reference 2] Japanese Unexamined Patent Publication No. Hei 2-86146

SUMMARY OF THE INVENTION

According to the technology of above-mentioned Patent Reference 2, there was a problem that a cavity would not be formed between wirings when the insulating film which covers a wiring is formed by a method with sufficient step coverage nature (step coverage).

Although a cavity will be formed between wirings on the other hand when the insulating film which covers a wiring is formed by the method that step coverage nature is bad, the upper occlusion position of a cavity becomes high. For this reason, when it is going to do flattening of the upper surface of this insulating film for example, by the CMP (Chemical Mechanical Polishing) method, there is a possibility that a cavity may make an opening on the insulating film upper surface after flattening. In this case, since the cleaning liquid used by the CMP method sinks in a cavity and the wiring material was made to corrode, there was a problem that the reliability of a semiconductor device fell.

The present invention is made in view of the above problems. A purpose is to offer a semiconductor device reliable even when it has the occluded cavity, and its manufacturing method.

A semiconductor device of this invention comprises a semiconductor substrate which has a main front surface, a plurality of convex patterns formed over a main front surface of the semiconductor substrate so that each might have a floating gate and a control gate, a first insulating film formed so that an upper surface and a side surface of each of the convex patterns might be covered, and so that width might become large rather than a portion which covers a lower part side surface of the convex pattern in a portion which covers an upper part side surface, and a second insulating film that covers an upper surface and a side surface of the first insulating film so that a cavity between the adjacent convex patterns may be occluded. A position occluded by the second insulating film of the cavity is a position higher than an upper surface of the floating gate, and a position lower than an upper surface of the control gate.

A method of manufacturing a semiconductor device according to one aspect of this invention comprises the steps of forming a plurality of convex patterns over a main front surface of a semiconductor substrate, forming a first insulating film that includes a silicon oxide film on first film formation conditions to which width becomes large rather than a portion which covers a lower part side surface of the convex pattern in a portion which covers an upper part side surface so that a side surface of each of the convex patterns may be covered, and forming a second insulating film over an upper surface and a side surface of the first insulating film on second film formation conditions that are easier to do horizontal direction growth than the first film formation conditions so that a cavity between the adjacent convex patterns may be occluded.

A method of manufacturing a semiconductor device according to another aspect of this invention comprises the steps of forming a plurality of convex patterns over a main front surface of a semiconductor substrate so that an aspect ratio of a trench formed between the adjacent convex patterns may become five or more, forming a first insulating film on first film formation conditions to which width becomes large rather than a portion which covers a lower part side surface of the convex pattern in a portion which covers an upper part side surface so that a side surface of each of the convex patterns may be covered, and forming a second insulating film over an upper surface and a side surface of the first insulating film on second film formation conditions that are easier to do horizontal direction growth than the first film formation conditions so that a cavity between the adjacent convex patterns may be occluded.

A method of manufacturing a semiconductor device according to another aspect of this invention comprises the steps of forming a plurality of convex patterns over a main front surface of a semiconductor substrate so that the each convex pattern may have a floating gate and a control gate, forming a first insulating film on first film formation conditions to which width becomes large rather than a portion which covers a lower part side surface of the convex pattern in a portion which covers an upper part side surface so that a side surface of each of the convex pattern may be covered, and forming a second insulating film over an upper surface and a side surface of the first insulating film on second film formation conditions that are easier to do horizontal direction growth than the first film formation conditions so that a cavity between the adjacent convex patterns may be occluded.

A method of manufacturing a semiconductor device according to another aspect of this invention comprises the steps of forming a plurality of convex patterns over a main front surface of a semiconductor substrate, forming a first insulating film on first film formation conditions to which width becomes large rather than a portion which covers a lower part side surface of the convex pattern in a portion which covers an upper part side surface so that a side surface of each of the convex pattern may be covered, doing redeposition to a side wall lower part of the first insulating film while doing sputtering of a side wall upper part of the first insulating film on second film formation conditions, and forming a second insulating film over an upper surface and a side surface of the first insulating film so that a cavity between the adjacent convex patterns may be occluded.

According to the semiconductor device of the present invention, a cavity is occluded in a position lower than the upper surface of a control gate. When CMP is performed after the second insulating film is formed by this, the problem of the corrosion by invasion of the cleaning liquid to a cavity is suppressed.

According to the manufacturing method of the semiconductor device of the aspect of 1 of the present invention, the first film formation conditions that are film formation conditions of the first insulating film are film formation conditions which cannot do horizontal direction growth as easily as the second film formation conditions that are film formation conditions of the second insulating film. The width of the first insulating film formed in the side surface of a convex pattern is suppressed by this, and a cavity with wide width is formed between convex patterns. The second film formation conditions that are film formation conditions of the second insulating film are film formation conditions which are easier to do horizontal direction growth than the first film formation conditions that are film formation conditions of the first insulating film. When the second insulating film is formed immediately after film formation of the first insulating film by this at the opening of the first insulating film currently formed in the upper end between adjacent convex patterns, an opening is occluded promptly. Therefore, it can prevent locating the occlusion position of the cavity by the second insulating film in the upper part too much. When CMP is performed after the second insulating film is formed by this, the problem of the corrosion by invasion of the cleaning liquid to a cavity is suppressed.

According to the manufacturing method of the semiconductor device according to other aspects of the present invention, the first insulating film consists of a silicon oxide film. Although the etching processing for through hole formation etc. may be made, when the first insulating film is a silicon oxide film, it can perform dry etching easily in this case.

According to the manufacturing method of the semiconductor device according to other aspects of the present invention, the aspect ratio of the trench formed between convex patterns is five or more. By this, while making an integration degree high, the height of a floating gate can fully be secured, and the coupling ratio of a floating gate and a control gate can be improved. Therefore, improvement in writing speed can be aimed at.

According to the manufacturing method of the semiconductor device according to other aspects of the present invention, the space between adjacent floating gates will mainly be occupied by a cavity, and the insulator which is dielectrics will not exist only a few. Hereby, the capacity between adjacent floating gates is reduced. Therefore, the so-called threshold value voltage Vth shift can be reduced, and the malfunction of a nonvolatile semiconductor memory can be suppressed.

According to the manufacturing method of the semiconductor device according to other aspects of the present invention, redeposition is made at the side wall lower part of the first insulating film, doing sputtering of the side wall upper part of the first insulating film. Hereby, the position of the shortest size part in the opening of a cavity can be made to shift below. Therefore, the position where a cavity is occluded by the second insulating film is controllable to the lower part side.

DETAILED DESCRIPTION OF THE PREFERRED EMBODIMENTS

Hereafter, embodiments of the invention are explained based on drawings.

Embodiment 1

Embodiment 1 of the present invention is one embodiment when the present invention is applied to the nonvolatile semiconductor memory which has Assist Gate. First, FIG. 1-FIG. 3 are used and explained about the structure.

Figure 1:
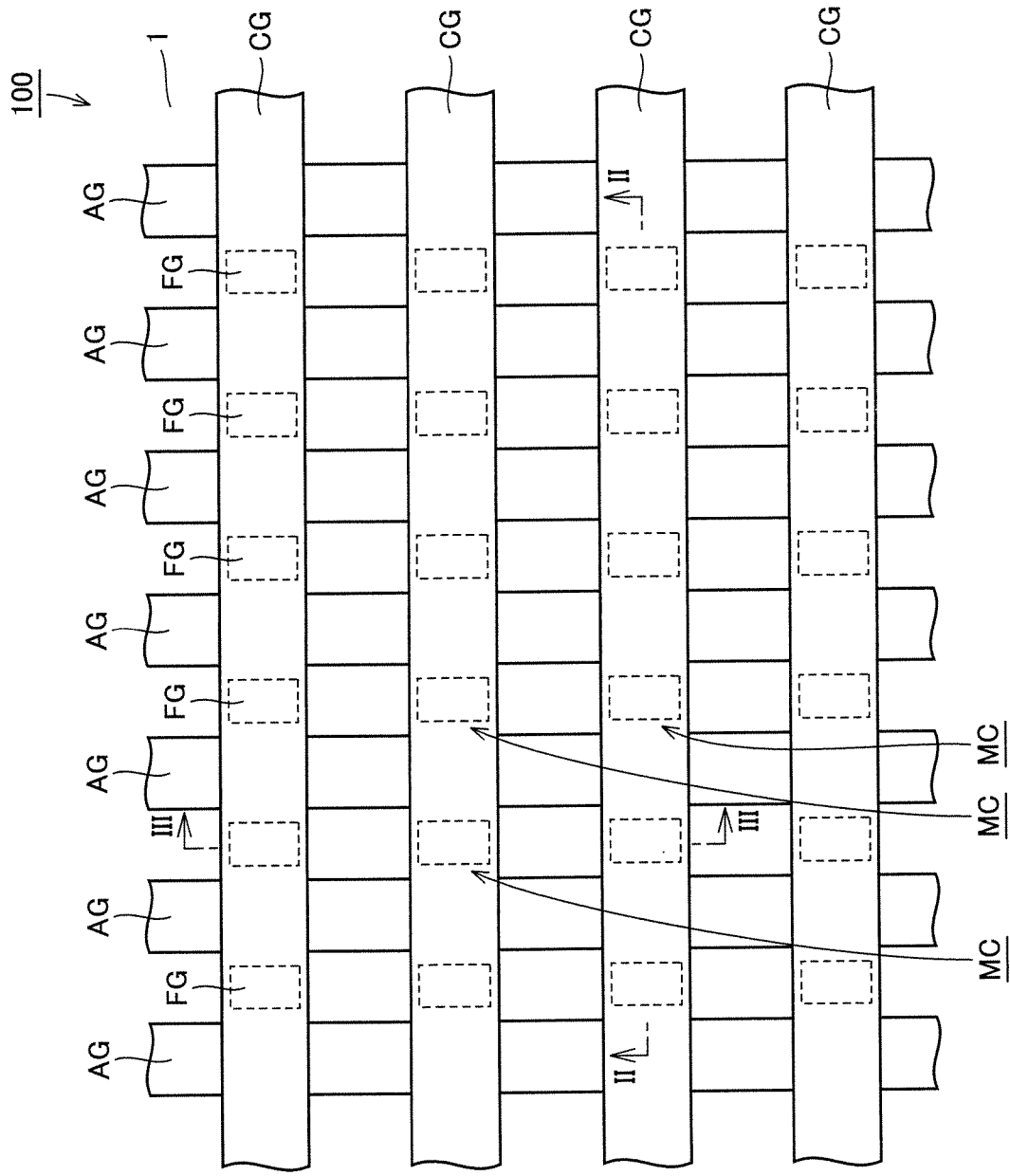
FIG. 1 is a plan view showing roughly the structure of the semiconductor device in Embodiment 1 of the present invention.

FIG. 1 is a plan view showing roughly the structure of the semiconductor device in Embodiment 1 of the present invention. Each of FIG. 2 and FIG. 3 is an outline cross-sectional view which goes along the II-II line and III-III line of FIG. 1.

With reference to FIG. 1, semiconductor device 100 has a memory cell array by which a plurality of memory cell MC has been arranged at matrix form. In this memory cell array, each of a plurality of Assist Gate AG formed on the front surface of semiconductor substrate 1 is arranged so that it may run in parallel mutually to the longitudinal direction in a drawing. In the direction (horizontal direction in a drawing) which intersects perpendicularly with these Assist Gate AG, each of a plurality of control gate CG is arranged so that it may run in parallel mutually. Under this control gate CG, a plurality of floating gates FG are arranged, and each of a plurality of floating gates FG is arranged between two Assist Gate 5.

Figure 2:
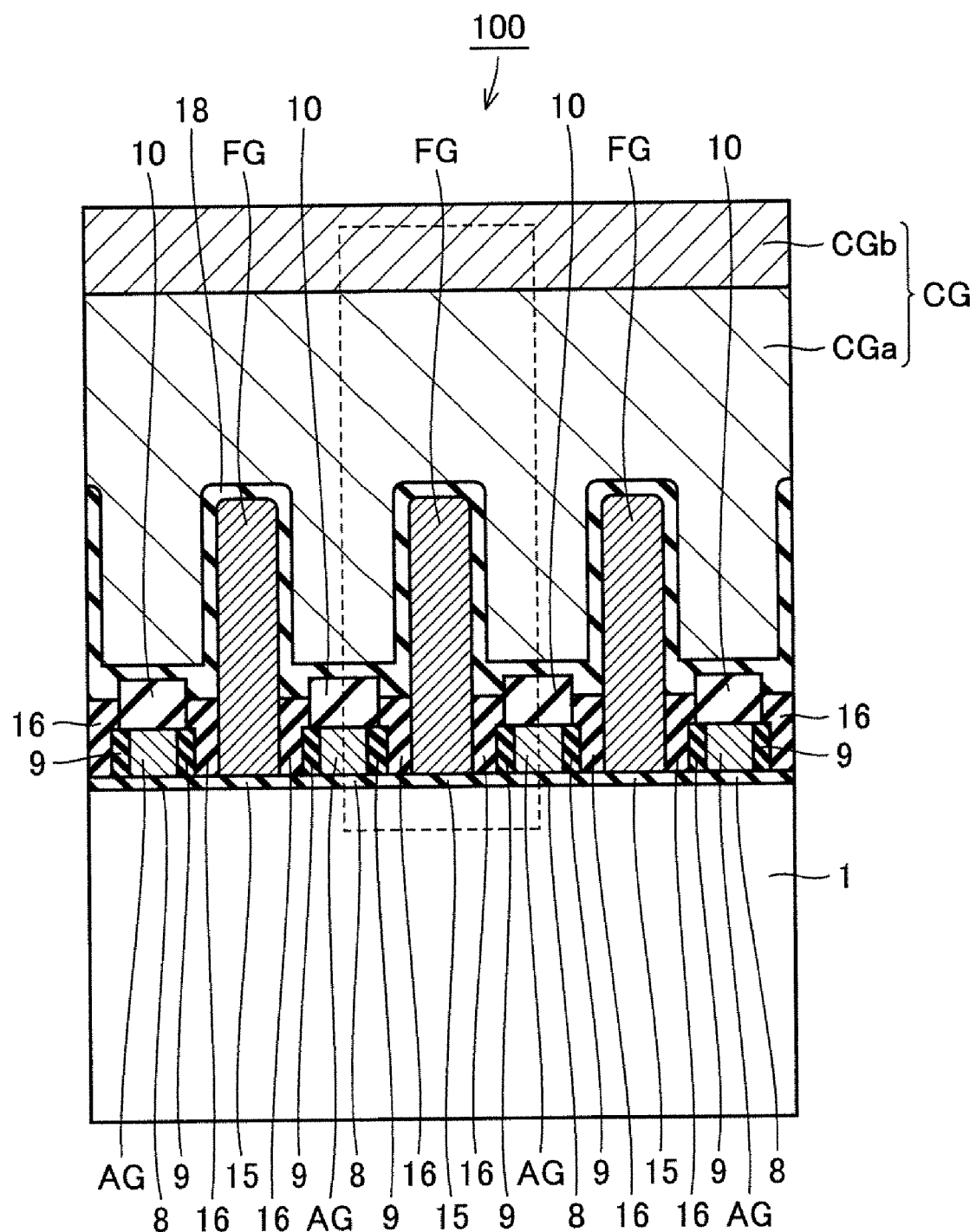
FIG. 2 is an outline cross-sectional view which goes along the II-II line of FIG. 1.
Figure 3:
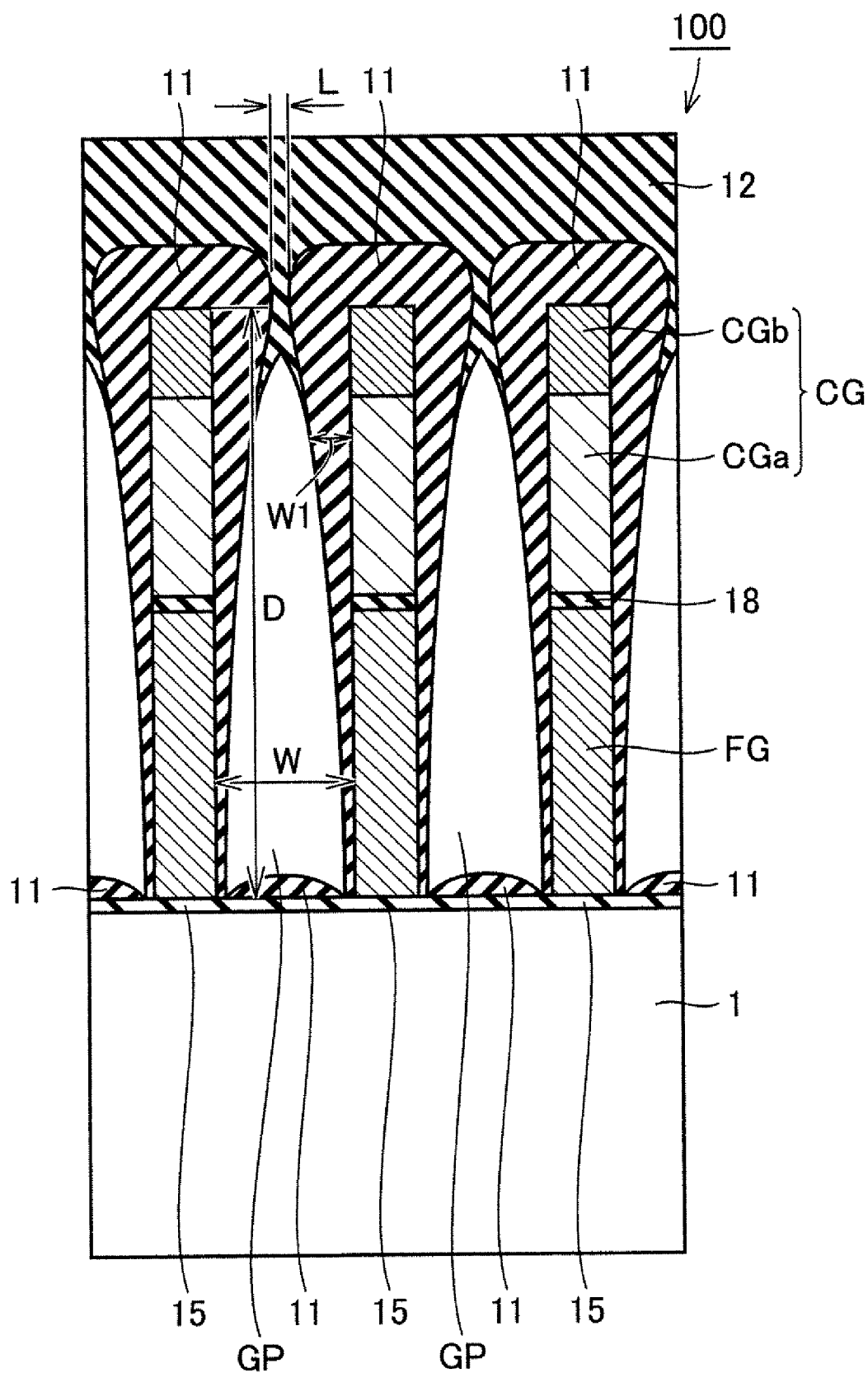
FIG. 3 is an outline cross-sectional view which goes along the III-III line of FIG. 1.

One memory cell MC is formed in the region surrounded with the dashed line in the drawing with reference to FIG. 2, and mainly has semiconductor substrate 1, one pair of Assist Gate AG formed via insulating film 8 on the main front surface of this semiconductor substrate 1, floating gate FG formed via insulating film 15 on the main front surface of semiconductor substrate 1, and control gate CG formed via insulating film 18 on the upper surface of this floating gate FG.

Assist Gate AG is formed, for example from the polycrystalline silicon film of low resistance, and insulating film 8 formed under Assist Gate AG consists of silicon oxide.

On the side surface of Assist Gate AG, insulating film 9 which consists of silicon oxide, for example is formed. On the upper surface of Assist Gate AG, insulating film 10 which consists of a silicon nitride ($Si_3N_4$ etc.), for example is formed.

Control gate CG is formed, for example of the laminated film of conductive layer CGa which consists of polycrystalline silicon of low resistance, and conductive layer CGb which consists of high melting point metal silicide films, such as tungsten silicide (WSix), etc. formed in the upper surface.

Floating gate FG is a charge storage layer of above-mentioned memory cell MC, for example, is formed with the polycrystalline silicon of low resistance.

On the main front surface of semiconductor substrate 1 located under floating gate FG, insulating film 15 which functions as a tunnel insulating film of memory cell MC is formed. This insulating film 15 is formed, for example from oxynitriding silicon (SiON) etc.

Between Assist Gate AG and floating gate FG, insulating film 9 and insulating film 16 are formed, and Assist Gate AG and floating gate FG are insulated. Insulating film 16 is formed from silicon oxide, for example. Insulating film 18 which separates control gate CG and floating gate FG is formed, for example by the so-called ONO film that laminated silicon oxide, a silicon nitride, and silicon oxide sequentially from the lower layer.

With reference to FIG. 3, insulating film 15 is formed on the main front surface of semiconductor substrate 1. A plurality of floating gates FG are formed in the upper surface of this insulating film 15. Insulating film 18 is formed on the upper surface of each floating gate FG. Control gate CG is formed on the upper surface of each insulating film 18. As for each control gate CG, the lower part is formed by conductive layer CGa, and the upper part is formed by conductive layer CGb.

As mentioned above, a plurality of convex patterns which have a layered product of floating gate FG, insulating film 18, and control gate CG which were mentioned above will be formed on semiconductor substrate 1 by which the front surface was covered with insulating film 15. Width W of the groove across which it faced with two adjacent convex patterns is 200 nm or less. The aspect ratio which is the numerical value (D/W) which divided depth D of this groove by width W is five or more.

First insulating film 11 is formed so that the upper surface and the side surface of each convex pattern which were mentioned above may be covered. Width W1 of insulating film 11 which covers the side surface of each convex pattern is large in the portion which covers an upside side surface from the portion which covers a lower part side surface of the convex pattern. Width W1 in the upper surface position of floating gate FG is 25 nm or less preferably. In near upper end, insulating film 11 which covers each convex pattern sets the gap of width L, and is separated and formed. Width L of this separation is 10 nm or more 20 nm or less, for example. First insulating film 11 thin enough compared with the thickness of floating gate FG is formed in the upper surface of insulating film 15 of the bottom-of-a-valley portion between convex patterns.

A silicon oxide film and a silicon nitride film are used for the material of first insulating film 11, for example. A boron, nitrogen, and fluorine may be doped as an impurity in the silicon oxide film. From a viewpoint of the processing ease in the etching step at the time of semiconductor device manufacture, a silicon oxide film is used suitably.

Second insulating film 12 that covers the upper surface and the side surface of first insulating film 11 is formed so that cavity GP between the adjacent convex patterns mentioned above may be occluded. This second insulating film 12 is filled up with a part for the separation part in the upper end of each 1st insulating film 11 that covers the adjacent convex pattern mentioned above. The position occluded by second insulating film 12 of cavity GP is a position higher than the upper surface of floating gate FG, and is a position lower than the upper surface of control gate CG.

A silicon oxide film and a silicon nitride film are used for the material of second insulating film 12, for example. A boron, nitrogen, and fluorine may be doped as an impurity in the silicon oxide film.

First and second insulating films 11 and 12 may be the same material mutually, and may be different material. Even when first and second insulating films 11 and 12 consist of the same material, first and second insulating films 11 and 12 can be distinguished (discerned) with both interface, both etch rate, etc.

Width W1 of first insulating film 11 is large in the portion which covers an upside side surface rather than the portion which covers a lower part side surface of each convex pattern. Therefore, as for the width of cavity GP, the lower side is large rather than the upside generally. Since floating gate FG is located in a convex pattern lower part rather than control gate CG, cavity GP with large width will exist in the region inserted into two floating gates FG.

In FIG. 3, the height of the occlusion position in the upper end of cavity GP constitutes a position between the under surface and the upper surface of conductive layer CGb. However, by controlling the thickness of first insulating film 11 and second insulating film 12, and the film formation conditions of first insulating film 11 and second insulating film 12 mentioned later, it is possible to control the height of the upper end of cavity GP in the range from a position higher than the upper surface of floating gate FG to a position lower than the upper surface of control gate CG. Preferably, the occlusion position in the upper end of cavity GP shall be less than 50 nm from the upper surface of control gate CG to a lower part.

Figure 4:
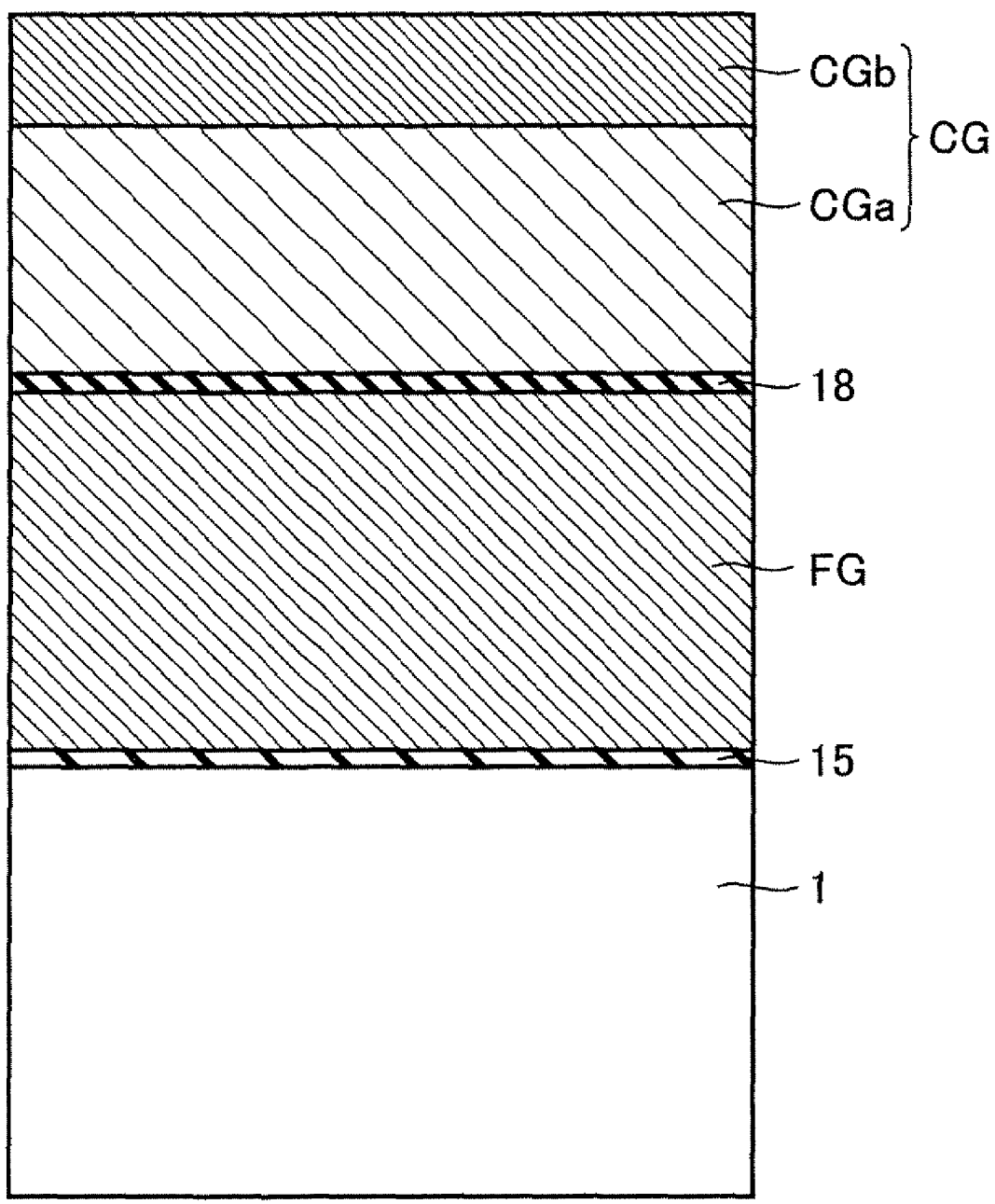
FIG. 4 is an outline cross-sectional view showing the first step of the manufacturing method of the semiconductor device in Embodiment 1 of the present invention.
Figure 5:
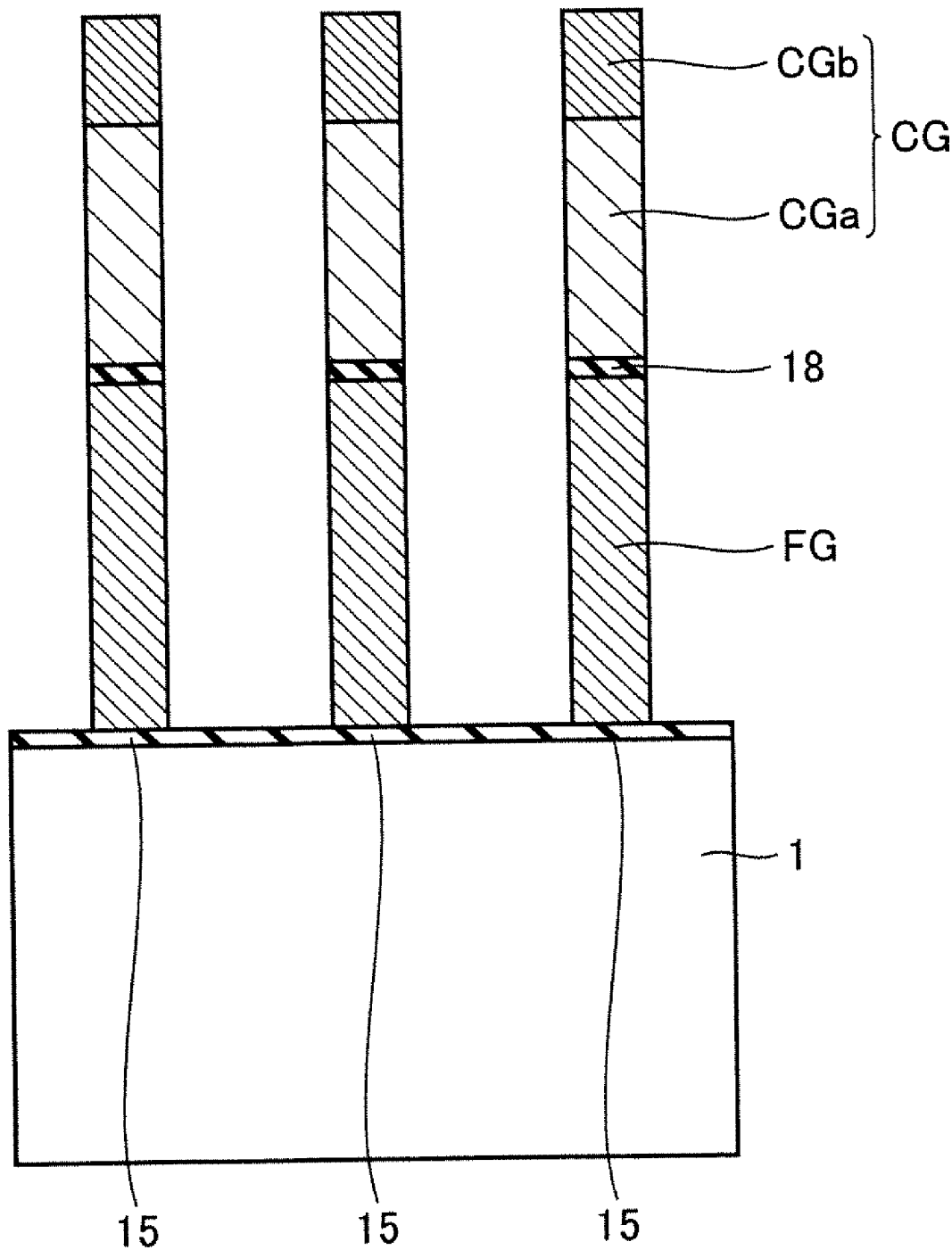
FIG. 5 is an outline cross-sectional view showing the second step of the manufacturing method of the semiconductor device in Embodiment 1 of the present invention.
Figure 6:
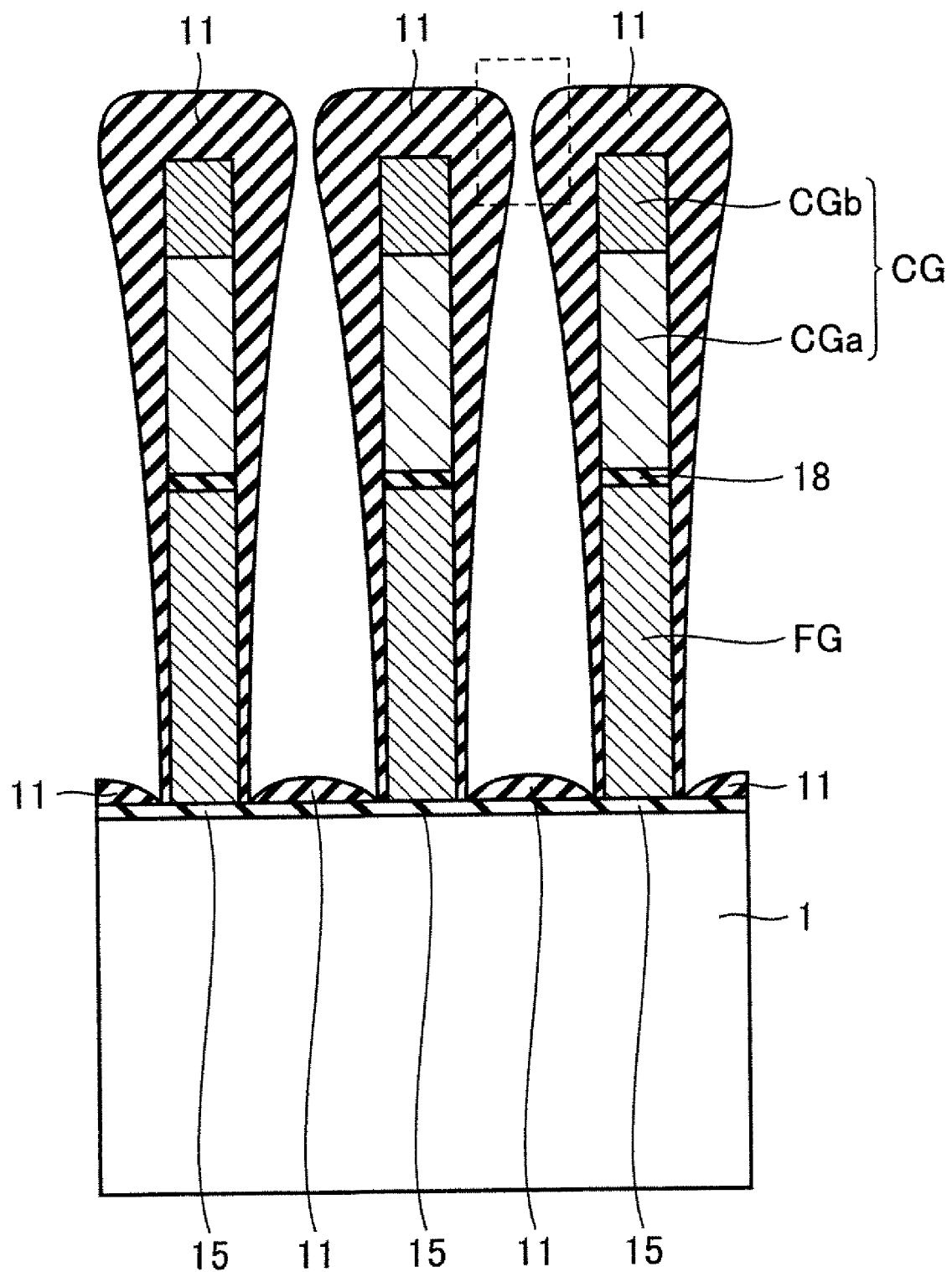
FIG. 6 is an outline cross-sectional view showing the third step of the manufacturing method of the semiconductor device in Embodiment 1 of the present invention.

Then, the manufacturing method of the semiconductor device in Embodiment 1 of the present invention is explained using drawings. FIG. 4-FIG. 6 are the outline cross-sectional views showing the manufacturing method of the semiconductor device in Embodiment 1 of the present invention in process order, and show the section corresponding to the III-III line in FIG. 1.

With reference to FIG. 4, insulating film 15, conductive layer FG for floating gates, insulating film 18, conductive layer CGa, and conductive layer CGb are laminated on the upper surface of semiconductor substrate 1. The section structure corresponding to the II-II line of the FIG. 1 in this state constitutes form shown in FIG. 2.

With reference to FIG. 5, photolithography process technology and etching technology are used for conductive layer CGb, CGa, conductive layer FG for floating gates, and insulating film 18, and patterning is given. Hereby, the convex pattern which consists of a layered product that floating gate FG, insulating film 18, conductive layer CGa, and conductive layer CGb are laminated in this order is formed via insulating film 15 on semiconductor substrate 1. On this occasion, patterning is performed so that the width of the groove pinched by two convex patterns may be 200 nm or less and the aspect ratio which divided the depth of the groove by the width of the groove may become five or more.

With reference to FIG. 6, first insulating film 11 is formed so that each upper surface and side surface of a plurality of convex patterns may be covered. This film formation condition is optimized so that the overhang of the first insulating film 11 may be done in the upper part of a convex pattern.

Film formation is ended before the cavity between two convex patterns occludes by upper end. Hereby, first insulating film 11 is formed so that width may become large in the portion which covers an upside side surface rather than the portion which covers a lower part side surface of a convex pattern.

With reference to FIG. 3, second insulating film 12 is formed so that cavity GP between convex patterns may be occluded and the upper surface and the side surface of first insulating film 11 may be covered. Second insulating film 12 is formed on the conditions which are easier to do horizontal direction growth than the film formation conditions of first insulating film 11. Here, a horizontal direction is a direction parallel to the front surface of semiconductor substrate 1.

In order to do flattening of the upper surface of second insulating film 12, CMP is given, and the structure of semiconductor device 100 shown in FIG. 3 can be obtained.

Next, the film formation conditions of first insulating film 11 and second insulating film 12 are explained in full detail. As mentioned above, film formation conditions are chosen on the film formation conditions of first insulating film 11, and the second film formation conditions of insulating film 12 so that it may become the film formation conditions in which the latter tends to do horizontal direction growth. Below, the concrete combination of the film formation conditions of first insulating film 11 and the film formation conditions of second insulating film 12 is explained.

As one combination, the film formation conditions of first insulating film 11 can be made into the conditions using the high-density-plasma chemical vapor deposition method (the HDP-CVD (High Density Plasma-Chemical Vapor Deposition) method is called hereafter) performed without applying the bias voltage of RF (Radio Frequency) to the substrate stage for laying semiconductor substrate 1, and the film formation conditions of second insulating film 12 can be made into the conditions using plasma chemical vapor deposition method (the P-CVD (Plasma-Chemical Vapor Deposition) method is called hereafter).

The above-mentioned HDP-CVD method is a method of generating high density plasma whose electron density is about $1\times10^{11}/cm^3$ according to the plasma source of for example, ICP (Inductively Coupled Plasma) or ECR (Electron Cyclotron Resonance), and forming a film, for example in a low vacuum with a pressure of about 1 Pa. When this HDP-CVD method is used, generally the bias voltage of RF may be applied to the substrate stage in which semiconductor substrate 1 is laid (a HDP-CVD method with RF bias application is called hereafter). However, the film formation conditions of first insulating film 11 in this embodiment are made into the conditions to which the bias voltage of RF is not applied (an RF-bias-application-less HDP-CVD method is called hereafter).

As other combination, the film formation conditions of first insulating film 11 are made into an RF-bias-application-less HDP-CVD method, and the film formation conditions of second insulating film 12 can be made into the conditions using sub atmospheric chemical vapor deposition method (the SA-CVD (Sub Atmospheric CVD) method is called hereafter).

SA-CVD method is the method of forming a film in semi-atmospheric pressure, for example, is a heat CVD method performed in more than 3 kPa and below 80 kPa in pressure. As second insulating film 12, a pure ozone TEOS (Tetra Ethyle Ortho Silicate) film and an ozone TEOS film including an impurity can be used, for example. Since SA-CVD method is a film formation method with high horizontal direction growth possibility, the film formation conditions of second insulating film 12 can be made into the conditions that horizontal direction growth possibility is higher than the film formation conditions of first insulating film 11.

The both sides of the film formation conditions of first insulating film 11 and second insulating film 12 can be made into the conditions using P-CVD method as other combination. Although two film formation conditions are common at the point that both are P-CVD methods as a basal condition, they can make both horizontal direction growth possibility different according to a difference of a process condition detail. And film formation conditions with higher horizontal direction growth possibility are used as film formation conditions for second insulating film 12.

As other combination, the film formation conditions of first insulating film 11 can be made into the conditions using P-CVD method, and the film formation conditions of second insulating film 12 can be made into the conditions using SA-CVD method. Since SA-CVD method is a film formation method with high horizontal direction growth possibility, the film formation conditions of second insulating film 12 can be made into the conditions that horizontal direction growth possibility is higher than the film formation conditions of first insulating film 11. As second insulating film 12, a pure ozone TEOS (Tetra Ethyle Ortho Silicate) film and an ozone TEOS film including an impurity can be used, for example.

As other combination, the film formation conditions of first insulating film 11 can be made into the conditions using an RF-bias-application-less HDP-CVD method, and the film formation conditions of second insulating film 12 can be made into the conditions using a HDP-CVD method with RF bias application. On this occasion, by the HDP-CVD apparatus provided with the bias application mechanism, when the conditions to which film formation is carried out as for first insulating film 11 without using a bias application mechanism and to which as for second insulating film 12 RF bias is applied by a bias application mechanism, and film formation is carried out are adopted, common equipment can perform two film formation.

In the combination of this film formation condition, film formation of first insulating film 11 is first performed by an RF-bias-application-less HDP-CVD method. Therefore, the directivity of the ion under film formation is reduced and film formation with low step coverage is made. For this reason, cavity GP with wide width is formed between adjacent convex patterns.

Then, film formation of second insulating film 12 is performed by a HDP-CVD method with RF bias application. While second insulating film 12 is formed a film with application of RF bias voltage to a substrate stage, the action by which sputtering of the first insulating film 11 is done and in which this sputtering material does redeposition occurs.

Figure 7:
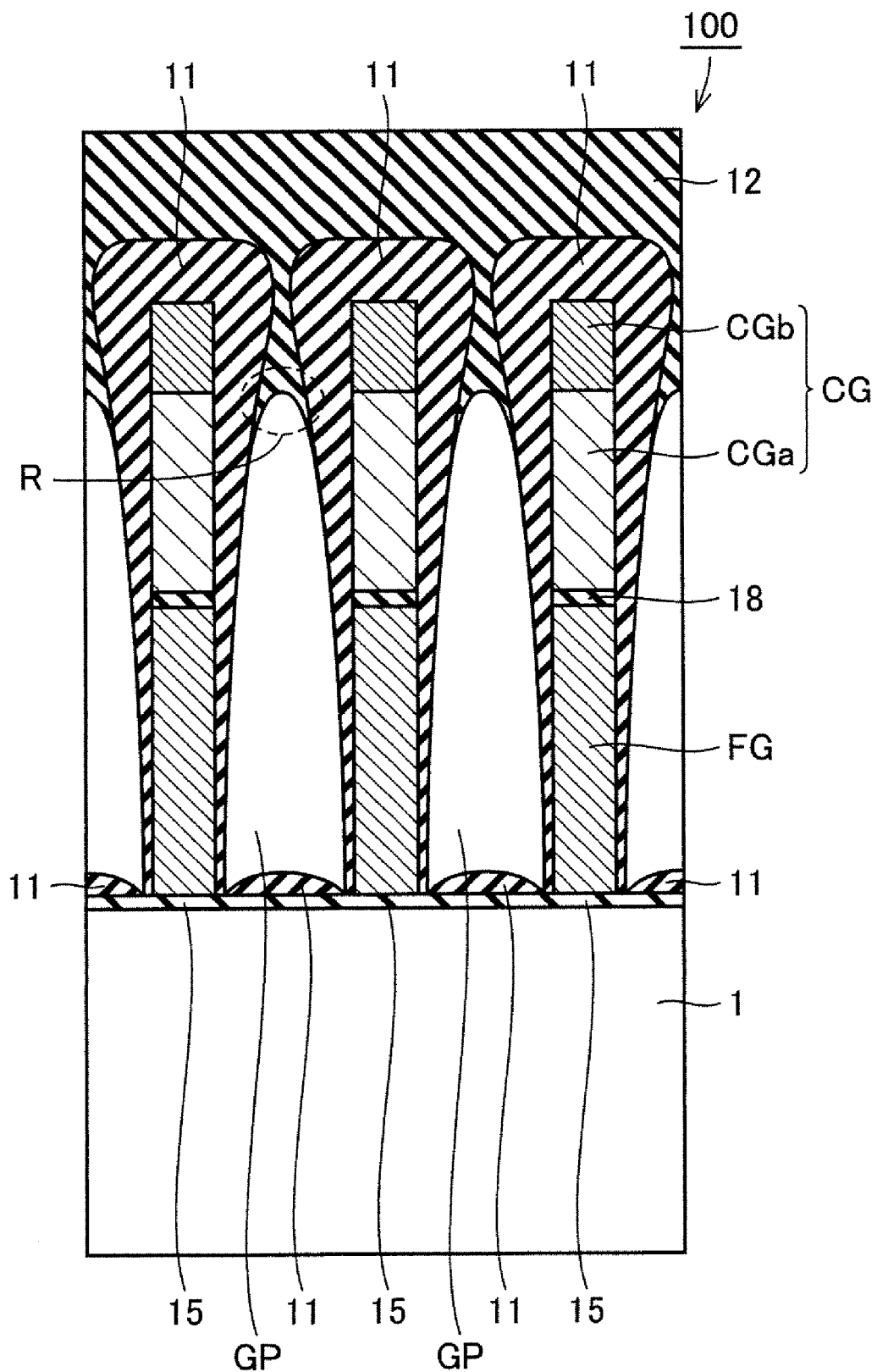
FIG. 7 is a cross-sectional view showing roughly the structure of the semiconductor device in Embodiment 1 of the present invention.

When the action of this sputtering redeposition is received, the occlusion position of cavity GP will be shifted below. The occlusion part upper end of cavity GP is in the tendency which is roundish as region R of FIG. 7 shows. This form can be confirmed by observing a section by SEM (Scanning Electron Microscope).

FIG. 7 is a cross-sectional view showing the structure of a semiconductor device at the time of forming second insulating film 12 with a HDP-CVD method with RF bias application. The section position of FIG. 7 is equivalent to the position corresponding to the III-III line in FIG. 1.

In order to perform control of the form and the occlusion position of cavity GP using the action of sputtering redeposition mentioned above, the film formation conditions of first insulating film 11 may not be limited to the conditions which used the RF-bias-application-less HDP-CVD method, and may be other P-CVD methods.

According to the semiconductor device of Embodiment 1 explained above, cavity GP is not made to occlude in the stage of film formation of first insulating film 11. Cavity GP is occluded by second insulating film 12 following it formed by the film formation conditions which are easier to do horizontal direction growth than the film formation conditions of first insulating film 11. This becomes possible to control the occlusion position of a cavity in a low position as compared with the case where a cavity is simply occluded only by film formation of first insulating film 11.

Thus, when the occlusion position of a cavity is controlled by the low position, in the CMP process performed after second insulating film 12 is formed, the problem of the corrosion by invasion of cleaning liquid is suppressed. Hereby, a reliable semiconductor device is obtained. In below, an example of the case where the occluded cavity is simply formed only by film formation of first insulating film 11 and this embodiment are compared, and this effect is explained.

Figure 8:
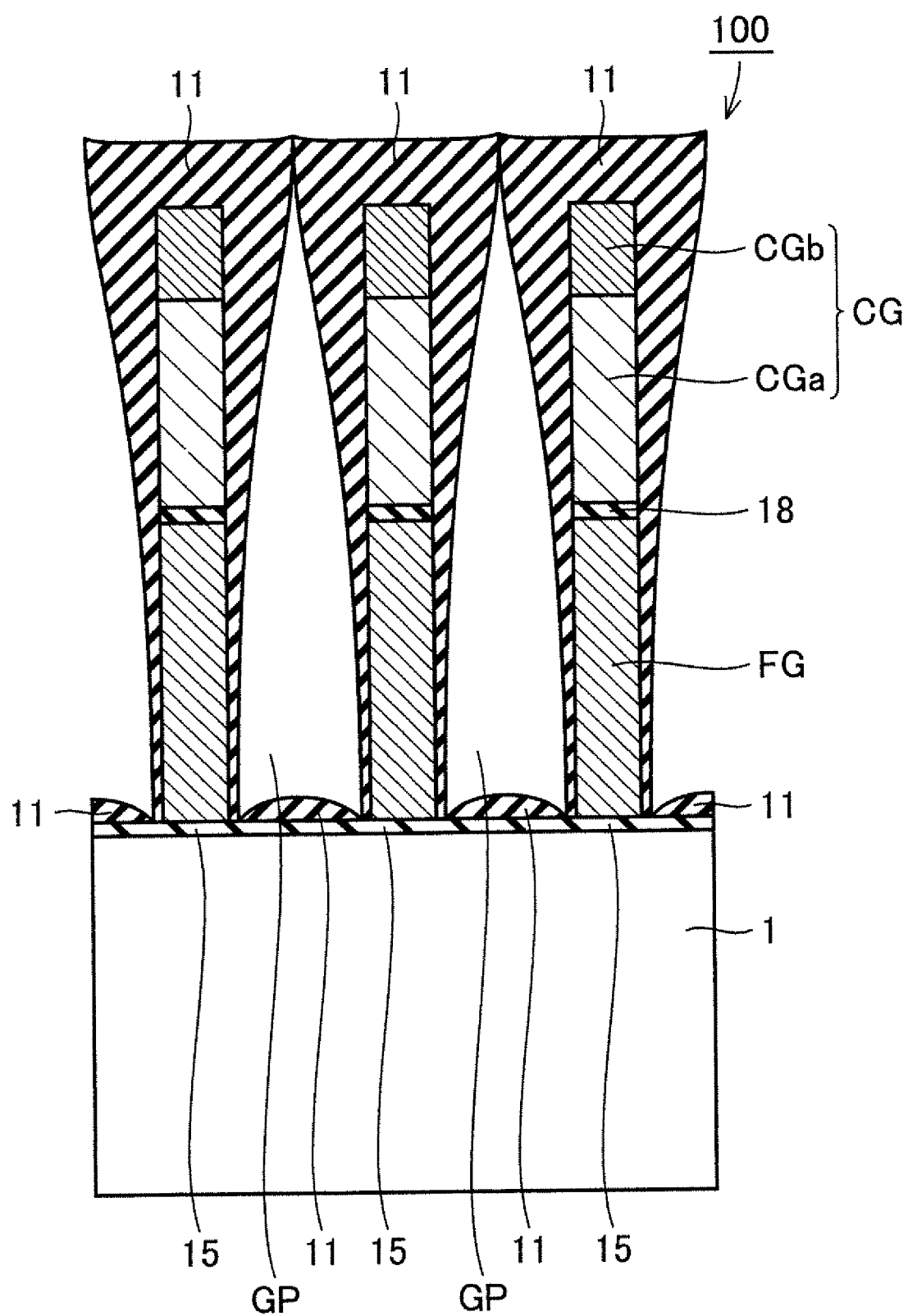
FIG. 8 is a cross-sectional view showing roughly an example of the structure of the semiconductor device in the comparative example of the present invention.

FIG. 8 is a cross-sectional view showing roughly an example of structure of having formed the cavity between convex patterns by one insulating film. The section position is equivalent to the section position shown in FIG. 3 or FIG. 7. When the cavity upper part is occluded only by first insulating film 11 with reference to FIG. 8, the occlusion position of the upper end of cavity GP is the upper part rather than control gate CG. In this case, even if CMP considered so that a polished surface might not reach to the uppermost surface of control gate CG is performed, the polished surface by CMP may reach the topmost part of cavity GP. Then, cavity GP makes an opening to a polished surface, cleaning liquid sinks into the inside of a cavity, and the corrosion of a conductive layer may occur. For this reason, the reliability of a semiconductor device will fall.

On the other hand, in this embodiment shown in FIG. 3 or FIG. 7, when CMP considered so that a polished surface might not reach to the uppermost surface of control gate CG is performed, the polished surface by CMP will not arrive at the topmost part of cavity GP. Therefore, the cleaning liquid of CMP does not sink into the inside of cavity GP, and the problem of the corrosion by cleaning liquid is prevented.

As for the side surface of each convex pattern mentioned above, according to the semiconductor device of this embodiment, the upside is covered with the insulating film with big width. The occlusion position in the upper end of cavity GP is at the position higher than the upper surface of floating gate FG. Cavity GP exists in the portion pinched by the upper surface of adjacent floating gate FG by this, and cavity GP whose width is still wider exists in a lower part rather than the upper surface of floating gate FG. The thickness of first insulating film 11 currently formed in the bottom of the recess between convex patterns is thin enough as compared with the thickness of floating gate FG. Therefore, since few dielectrics exist between adjacent floating gates FG, the capacity between adjacent floating gates FG is reduced. Hereby, the so-called threshold value voltage Vth shift can be reduced, and the malfunction of a semiconductor device can be suppressed.

When the size in the upper surface position of floating gate FG of width W1 of first insulating film 11 is 25 nm or less with reference to FIG. 3, adjacent floating gate FG(s) are separated by cavity GP with wider width. Therefore, the malfunction of a semiconductor device mentioned above can be suppressed more surely.

According to the semiconductor device of this embodiment, the aggregate of floating gate FG, insulating film 18, and control gate CG forms a plurality of convex patterns on semiconductor substrate 1 by which the front surface was covered with insulating film 15. And the width of the groove across which it faced with two adjacent convex patterns is 200 nm or less. For this reason, since the pitch of control gate CG can be made small, improvement in the integration degree of memory cell MC can be aimed at.

According to the semiconductor device of this embodiment, as shown in FIG. 3, the aspect ratio (D/W) which is the numerical value which divided depth D of the above-mentioned groove by width W is five or more. By this, the convex pattern of the height of 5 times or more of the width of a groove will be formed. Therefore, the height of floating gate FG which is a constituent element of a convex pattern is fully securable. When the height of floating gate FG can fully be secured with reference to FIG. 2, the area at which a floating gate FG side surface faces via insulating film 18 with control gate CG becomes wide. Hereby, the coupling ratio between control gate CG and floating gate FG can be improved. Therefore, improvement in the write-in characteristics of memory cell MC can be aimed at.

According to the manufacturing method of the semiconductor device of this embodiment, the first film formation conditions that are film formation conditions of first insulating film 11 are film formation conditions which cannot do horizontal direction growth as easily as the second film formation conditions that are film formation conditions of second insulating film 12. For this reason, the width of first insulating film 11 formed in the side surface of a convex pattern is suppressed, and, as a result, cavity GP with wide width is formed.

According to the manufacturing method of the semiconductor device of this embodiment, the second film formation conditions that are film formation conditions of second insulating film 12 are film formation conditions which are easier to do horizontal direction growth than the first film formation conditions that are film formation conditions of first insulating film 11. For this reason, when second insulating film 12 is formed on the opening currently formed between the convex patterns which adjoin each other immediately after film formation of first insulating film 11, an opening is occluded promptly. Therefore, it can prevent locating the occlusion position of cavity GP in the upper part too much.

According to the manufacturing method of the semiconductor device of this embodiment, first insulating film 11 can be made into a silicon oxide film. First insulating film 11 has the need that the etching processing for through hole formation etc. is made, in the position which is not illustrated. On this occasion, when it is a silicon oxide film, it is possible to perform dry etching easily as compared with the case where a nitride film etc. is used.

According to the manufacturing method of the semiconductor device of this embodiment, the first film formation conditions that are film formation conditions of first insulating film 11 can be made into an RF-bias-application-less HDP-CVD method. The directivity of the ion in the first film formation can be reduced by this, and film formation with low step coverage nature (step coverage) can be performed.

According to the manufacturing method of the semiconductor device of this embodiment, the second film formation conditions that are film formation conditions of second insulating film 12 can be made into SA-CVD method. Hereby, it shall be easy to do horizontal direction growth of the second film formation conditions.

According to the manufacturing method of the semiconductor device of this embodiment, the second film formation conditions that are film formation conditions of second insulating film 12 can be made into a HDP-CVD method with RF bias application. Since film formation and sputtering happen simultaneously in film formation of second insulating film 12 by this, roundness can be given to the occlusion form of the top end of a cavity. The occlusion position of cavity GP is controllable by setup of the ratio of this film formation and sputtering.

Embodiment 2

Embodiment 2 of the present invention is one embodiment when the present invention is applied to the nonvolatile semiconductor memory which has Assist Gate. In the manufacturing method of this embodiment, the sputtering redeposition step of first insulating film 11 is performed between the film formation step of first insulating film 11, and the film formation step of second insulating film 12. Below, FIG. 4-FIG. 6, and FIG. 9-FIG. 11 are used and explained about this embodiment.

Figure 9A:
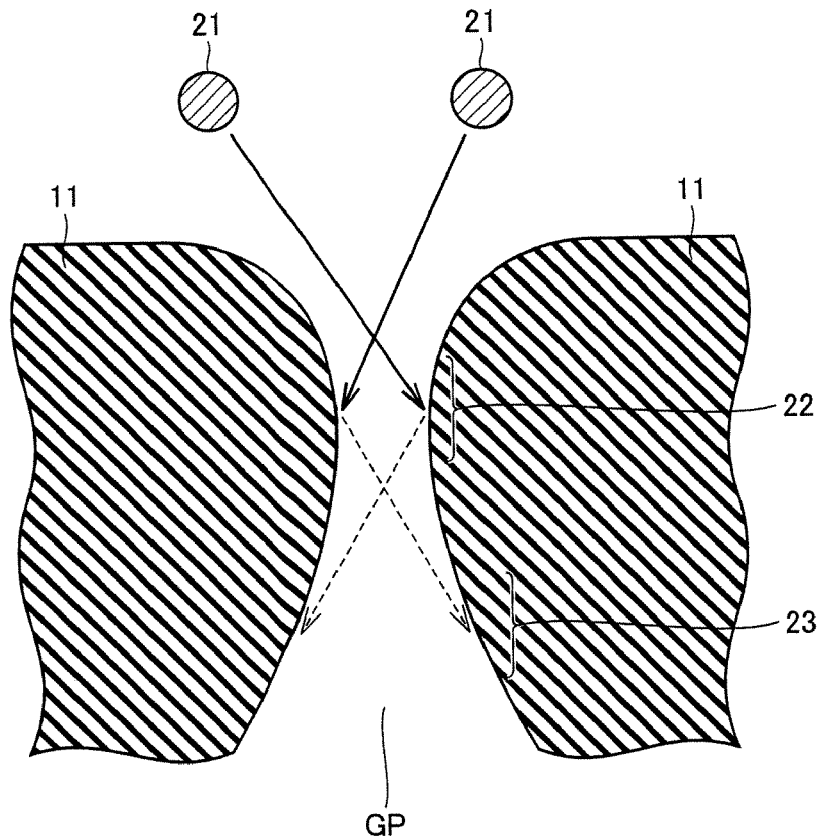
FIGS. 9A and 9B are outline cross-sectional views showing a part for each opening of a cavity of the state before sputtering redeposition processing FIG. 9A and the state after sputtering redeposition processing FIG. 9B in Embodiment 2 of the present invention.
Figure 9B:
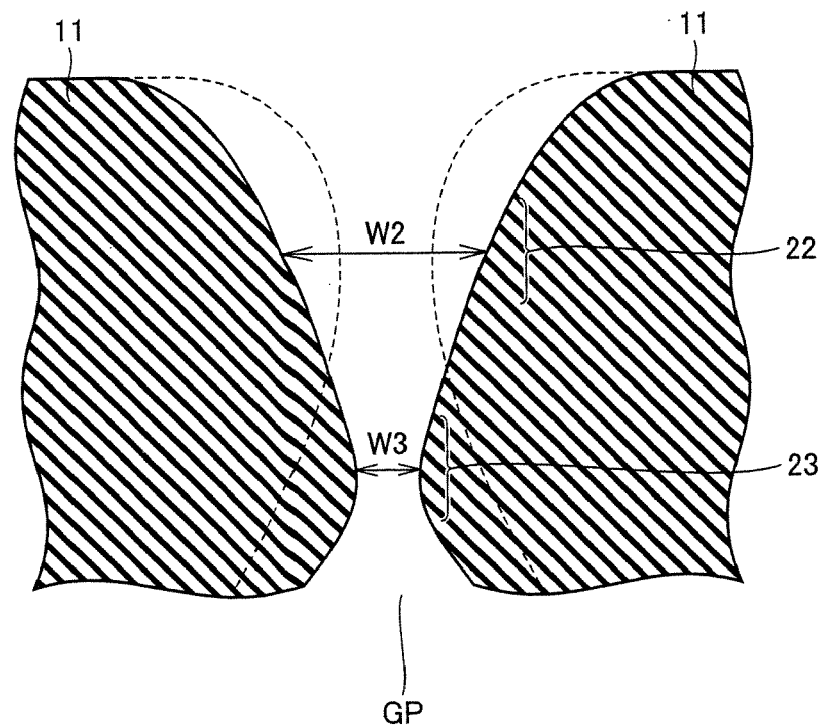
Figure 10:
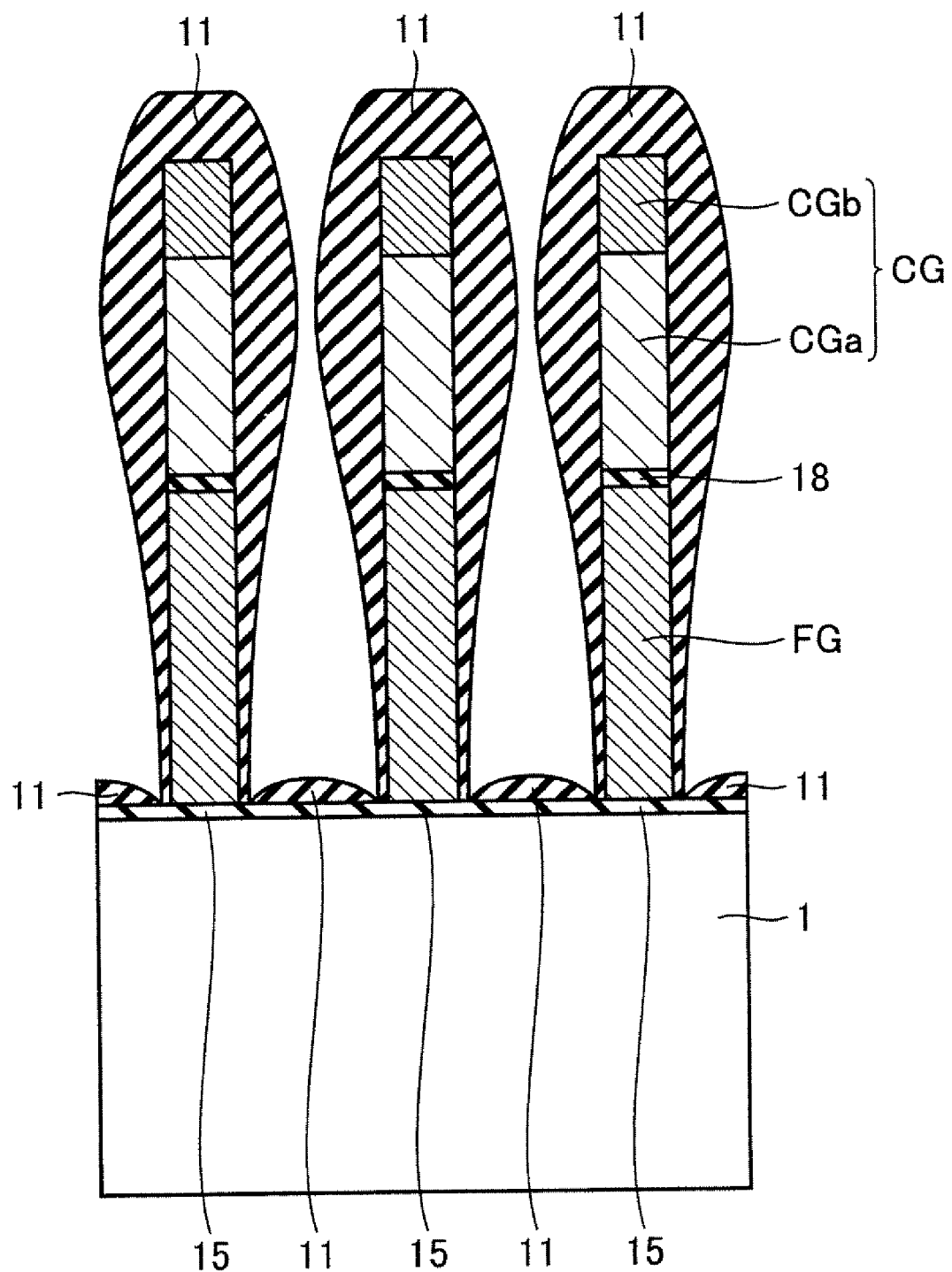
FIG. 10 is an outline cross-sectional view showing the state after sputtering redeposition processing in the manufacturing process of the semiconductor device in Embodiment 2 of the present invention.
Figure 11:
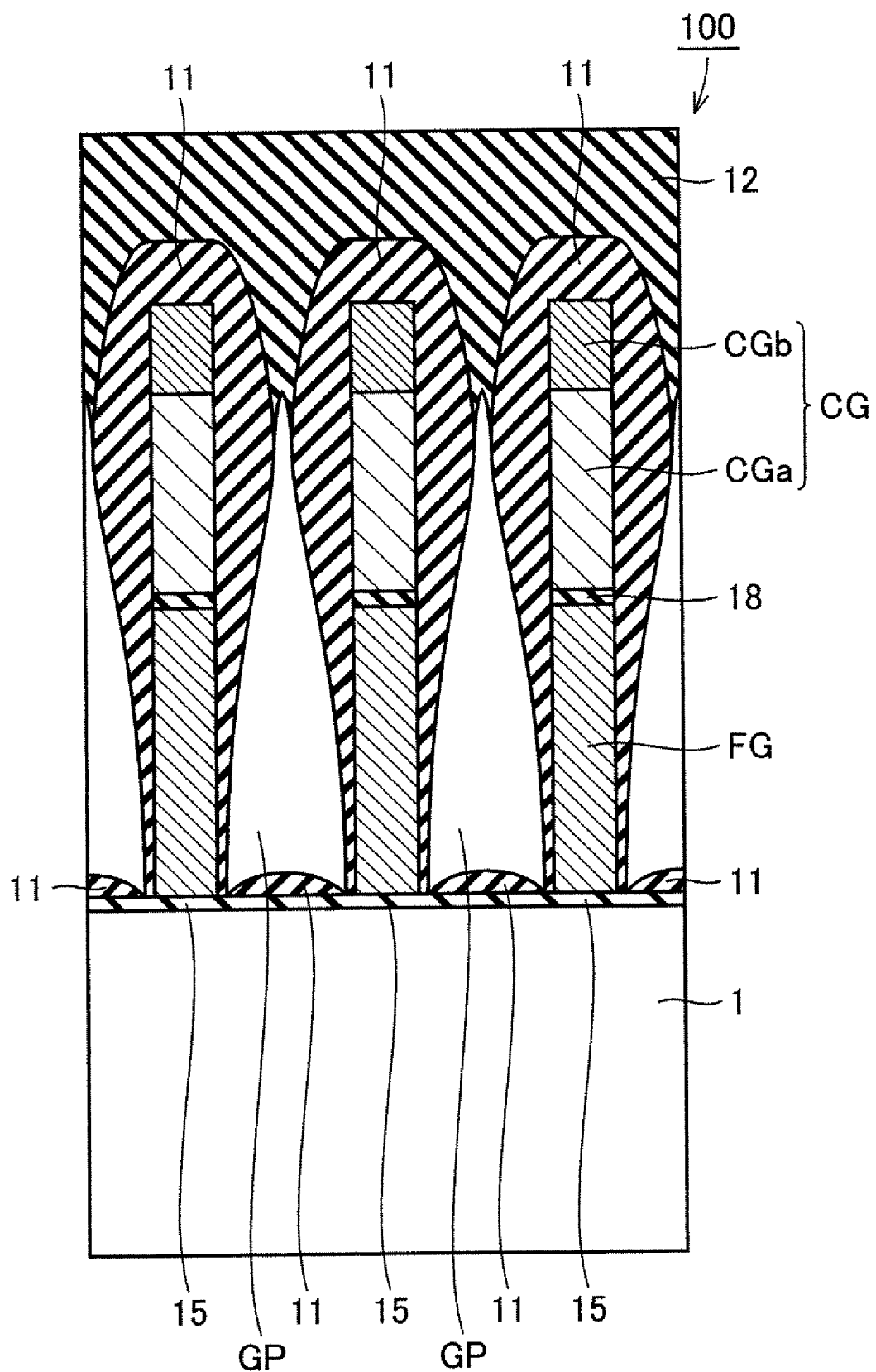
FIG. 11 is a cross-sectional view showing roughly the structure of the semiconductor device in Embodiment 2 of the present invention.

FIGS. 9A and 9B are outline cross-sectional views showing the state before sputtering redeposition processing FIG. 9A and the state after sputtering redeposition processing FIG. 9B in Embodiment 2 of the present invention, and is a cross-sectional view of the region corresponding to the region surrounded in the dashed line part of FIG. 6. FIG. 10 and FIG. 11 are the outline cross-sectional views showing the manufacturing method of the semiconductor device in Embodiment 2 of the present invention after the sputtering redeposition processing shown in FIGS. 9A and 9B at process order.

The manufacturing method of this embodiment passes through the same step as the step of Embodiment 1 shown in FIG. 4-FIG. 6 first. Then, above-mentioned sputtering redeposition processing is performed to first insulating film 11.

With reference to FIG. 9A, this sputtering redeposition processing is performed, for example using a high-density-plasma chemical vapor deposition apparatus. Although the typical application as equipment of a high-density-plasma chemical vapor deposition apparatus is forming films, a setup of process conditions can also perform sputtering redeposition processing to semiconductor substrate 1.

By making this process condition into conditions which apply bias voltage to the substrate stage in which semiconductor substrate 1 was laid, charged particle 21 in a process chamber can be accelerated to the side of semiconductor substrate 1. This accelerated charged particle 21 collides with sputtering region 22 which is the upper part of the side surface of first insulating film 11 in the opening of cavity GP, as the solid line arrow in a drawing shows. In the front surface of this sputtering region 22, sputter etching of the first insulating film 11 is done. Hereby, as shown in FIG. 9B, in near the opening of cavity GP, the form of the side surface of first insulating film 11 turns into form shown as a solid line from the form shown with a dashed line. Width W2 of cavity GP pinched by sputtering region 22 spreads.

The structure material of first insulating film 11 by which sputtering was done disperses, as the dashed line arrow of FIG. 9A shows, and redeposition is done to redeposition region 23. Hereby, as shown in FIG. 9B, in near the opening of cavity GP, the form of the lower part of the side surface of first insulating film 11 turns into form shown as a solid line from the form shown with a dashed line. Width W3 of cavity GP pinched by redeposition region 23 becomes narrow.

As compared with the FIG. 6 which shows the state before sputtering, the position of the portion of the non-occluded cavity strangulated most descends according to the action of the sputtering redeposition processing mentioned above with reference to FIG. 10. The open end of a non-occluded cavity will become the widened state by sputtering.

With reference to FIG. 11, second insulating film 12 is formed in the upper surface and the side surface of first insulating film 11 so that cavity GP between convex patterns may be occluded. By manufacturing by this method, the occlusion position of the upper end of cavity GP becomes a lower part as compared with the structure of the FIG. 3 which shows the semiconductor device of Embodiment 1.

Next, the concrete combination of the film formation conditions of first insulating film 11 and the film formation conditions of second insulating film 12 is explained.

As one combination, the film formation conditions of first insulating film 11 can be made into the conditions using P-CVD method, and the film formation conditions of second insulating film 12 can be made into the conditions using a HDP-CVD method with RF bias application.

As other combination, the film formation conditions of first insulating film 11 can be made into the conditions using P-CVD method, and the film formation conditions of second insulating film 12 can be made into the conditions using an RF-bias-application-less HDP-CVD method.

The film formation conditions of first insulating film 11 and second insulating film 12 can be made into the conditions using P-CVD method as other combination.

As other combination, the film formation conditions of first insulating film 11 can be made into the conditions using P-CVD method, and the film formation conditions of second insulating film 12 can be made into the conditions using SA-CVD method.

Preferably, on the film formation conditions of first insulating film 11, and the film formation conditions of second insulating film 12, film formation conditions are chosen so that the latter may become the film formation conditions which are easy to do horizontal direction growth.

According to the manufacturing method of the semiconductor device of this embodiment, by sputtering, while the position of the gap part sandwiched by first insulating film 11 where width is the narrowest descends, the width of an opening is expanded in near the upper surface of first insulating film 11. Hereby, the position where a cavity is occluded by second insulating film 12 is controlled below. Therefore, it becomes possible by adjusting a sputtering condition to control an occlusion position.

According to the manufacturing method of the semiconductor device of this embodiment, sputtering can be performed using a high-density-plasma chemical vapor deposition apparatus. Hereby, when at least one film formation of first insulating film 11 or second insulating film 12 is made to be performed using a high-density-plasma chemical vapor deposition apparatus, the equipment can be made to serve a double purpose. The work which breaks a vacuum and carries semiconductor substrate 1 to another equipment becomes unnecessary.

Embodiment 3

Embodiment 3 of the present invention is one embodiment when the present invention is applied to the semiconductor device provided with the image sensor. First, FIG. 12 and FIG. 13 are used and explained about the structure.

Figure 12:
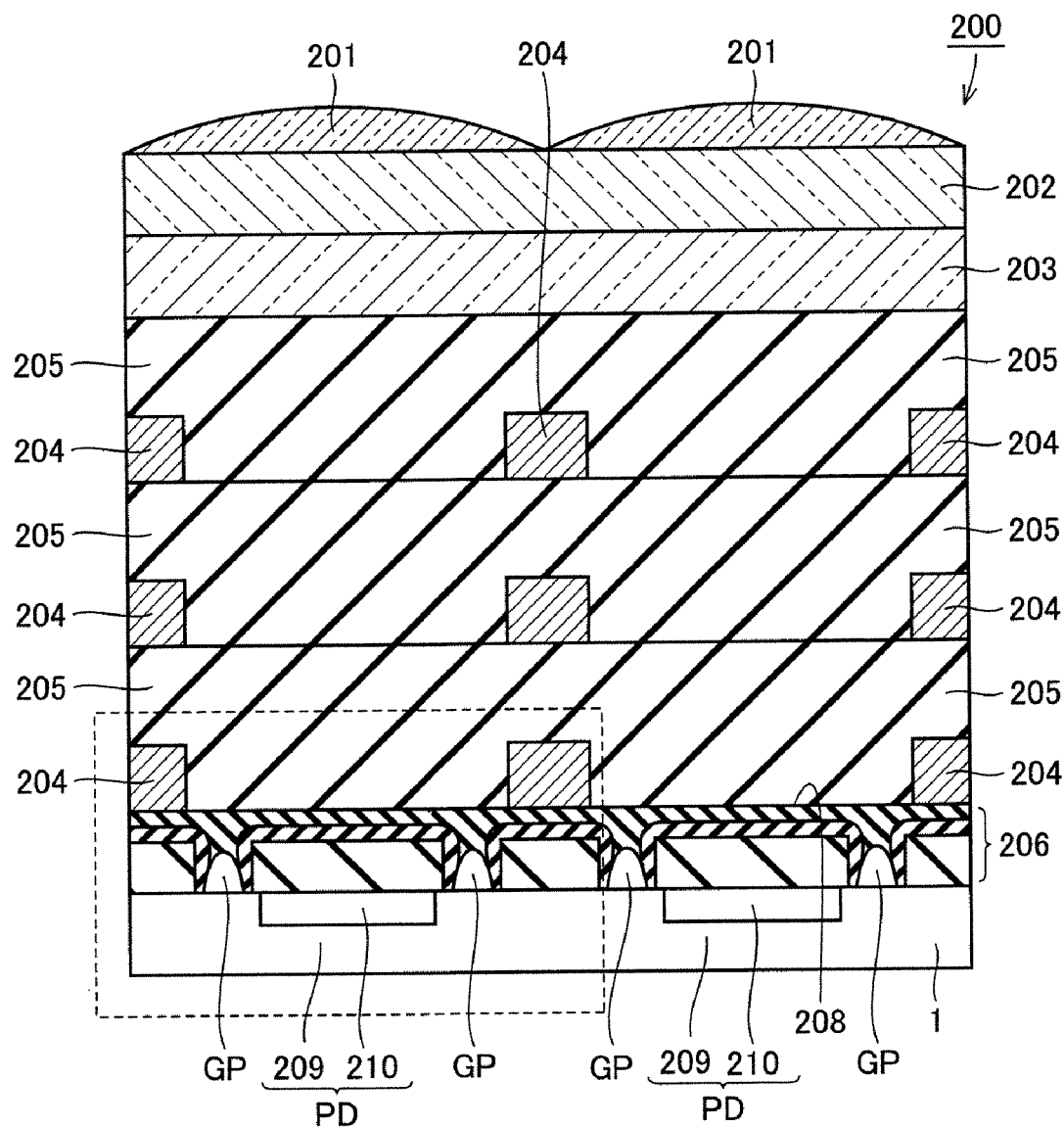
FIG. 12 is a cross-sectional view showing roughly the structure of the semiconductor device in Embodiment 3 of the present invention.

FIG. 12 is a cross-sectional view showing roughly the structure of the semiconductor device provided with the image sensor in this embodiment. With reference to FIG. 12, semiconductor device 200 provided with the image sensor is provided with photo diode PD as an image sensor formed in semiconductor substrate 1. This photo diode PD is formed by n type impurity region 210 and p type well region 209.

First interlayer insulating layer 206 is formed in the front surface of semiconductor substrate 1. The detail of the structure of first interlayer insulating layer 206 is mentioned later. The upper surface of first interlayer insulating layer 206 is CMP polished surface 208 polished by CMP. Patterned wiring layer 204 and second interlayer insulating layer 205 that covers wiring layer 204 upper part are formed in the upper surface of CMP polished surface 208. The structure of this wiring layer 204 and second interlayer insulating layer 205 is repeated multiple times (for example, 3 times) to the upper layer. Color filter 203 is formed in the upper surface of second interlayer insulating layer 205 of the top layer in this repeated structure, flattening layer 202 is formed in the upper surface, and micro lens 201 is formed in the upper surface.

Figure 13:
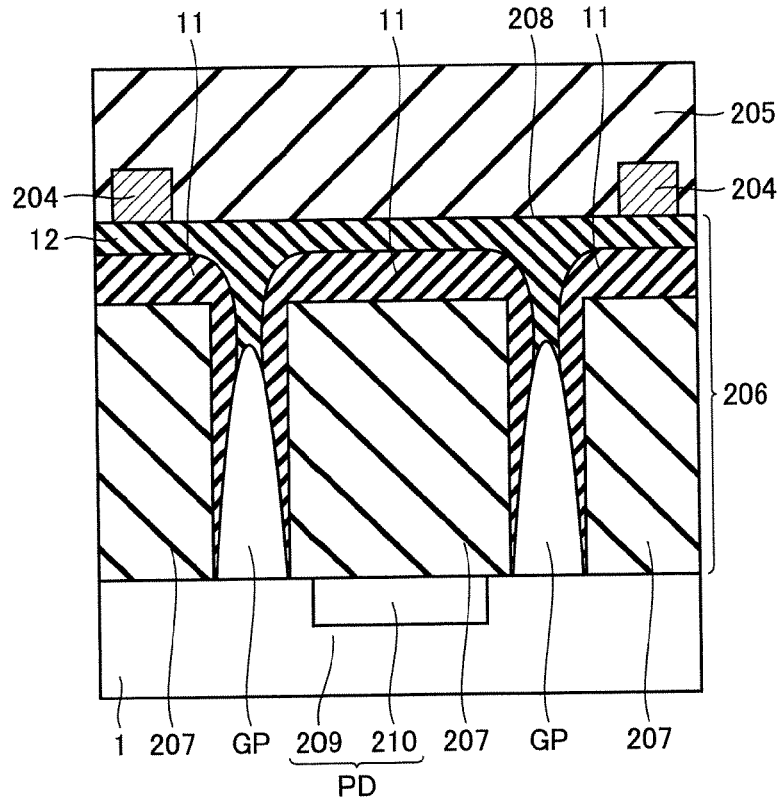
FIG. 13 is an outline enlarged view of the region enclosed by the dashed line part of FIG. 12.

FIG. 13 is an enlarged view of the dashed line part of FIG. 12. With reference to FIG. 13, first interlayer insulating layer 206 has insulating film 207 which exists so that the upper surface of photo diode PD may be covered, and has transparency, first insulating film 11 that is formed so that the side surface and the upper surface of this insulating film 207 may be covered and that has transparency, and second insulating film 12 that was formed in the upper surface and the side surface of first insulating film 11 so that cavity GP which exists between adjacent insulating films 207 might be occluded in the upper part and that has transparency.

Hereby, cavity GP is formed in the outer edge section of photo diode PD. Therefore, total reflection of a part of light which has entered from the upper part is done in the interface portions of first insulating film 11 and cavity GP, and it is led to photo diode PD. Therefore, since much light enters into photo diode PD as compared with the case where there is no cavity GP, the performance of an image sensor can be improved.

Then, the manufacturing method of the semiconductor device provided with the image sensor in this embodiment is explained using FIG. 14-FIG. 17.

Figure 14:
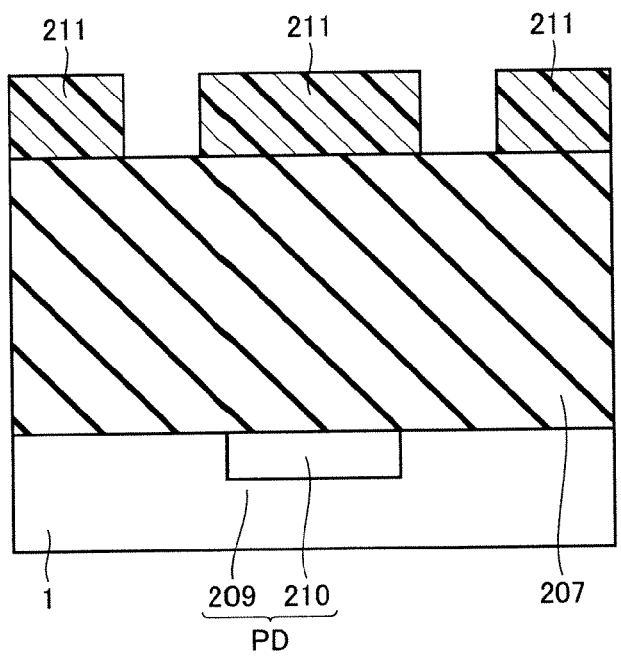
FIG. 14 is an outline cross-sectional view showing the first step of the manufacturing method of the semiconductor device in Embodiment 3 of the present invention.

FIG. 14-FIG. 17 are the outline cross-sectional views showing the manufacturing method of the image sensor as a semiconductor device in Embodiment 3 of the present invention at process order. With reference to FIG. 14, photo diode PD which consists of n type impurity region 210 and p type well region 209 is formed in semiconductor substrate 1 by the usual semiconductor process. Insulating film 207 is formed on the upper surface of semiconductor substrate 1, and resist pattern 211 is formed in the upper surface. Then, after etching of insulating film 207 is performed by using this resist pattern 211 as a mask, resist pattern 211 is removed.

Figure 15:
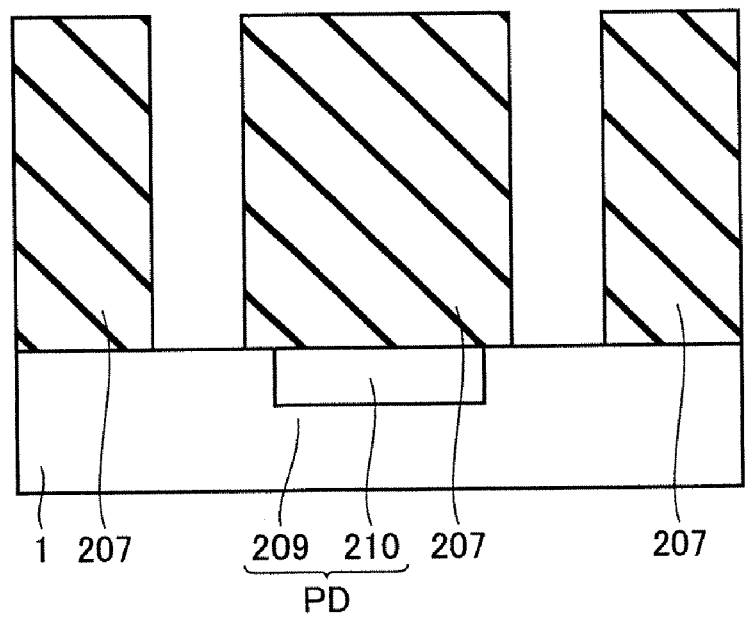
FIG. 15 is an outline cross-sectional view showing the second step of the manufacturing method of the semiconductor device in Embodiment 3 of the present invention.

With reference to FIG. 15, etching removal of the insulating film 207 is done in the region surrounding photo diode PD. As a result, a plurality of convex patterns which consist of insulating film 207 are formed on the main front surface of semiconductor substrate 1.

Figure 16:
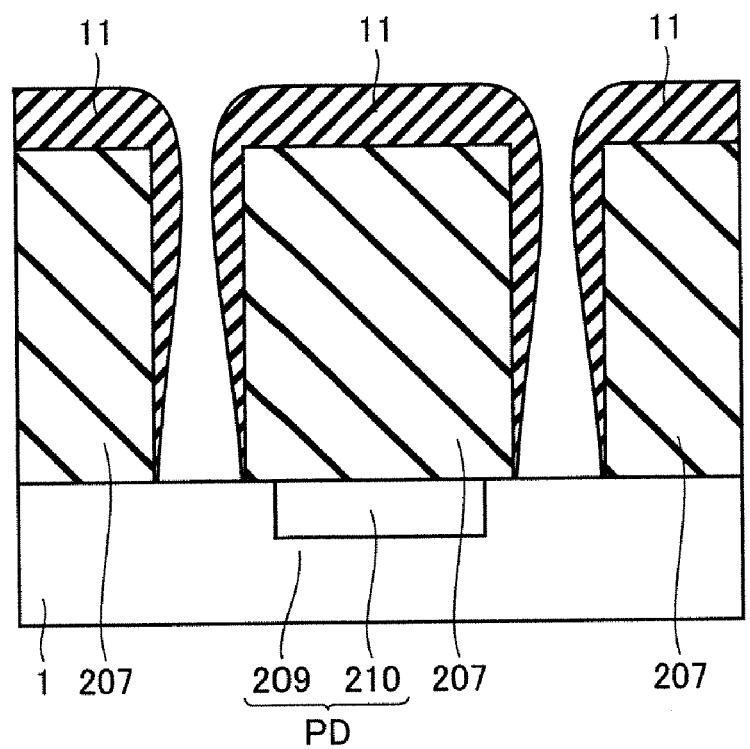
FIG. 16 is an outline cross-sectional view showing the third step of the manufacturing method of the semiconductor device in Embodiment 3 of the present invention.

First insulating film 11 is formed so that each side surface of a plurality of convex patterns which consist of insulating film 207 may be covered with reference to FIG. 16. The width of first insulating film 11 is formed so that it may become small in the portion which covers the lower part side surface of insulating film 207, and it is formed so that it may become large in the portion which covers an upper side. Although the cavity surrounded by first insulating film 11 exists between adjacent insulating films 207, it is not occluded yet but the upper end of this cavity constitutes an opening. The same conditions as Embodiment 1 can be used for the film formation conditions of first insulating film 11.

Figure 17:
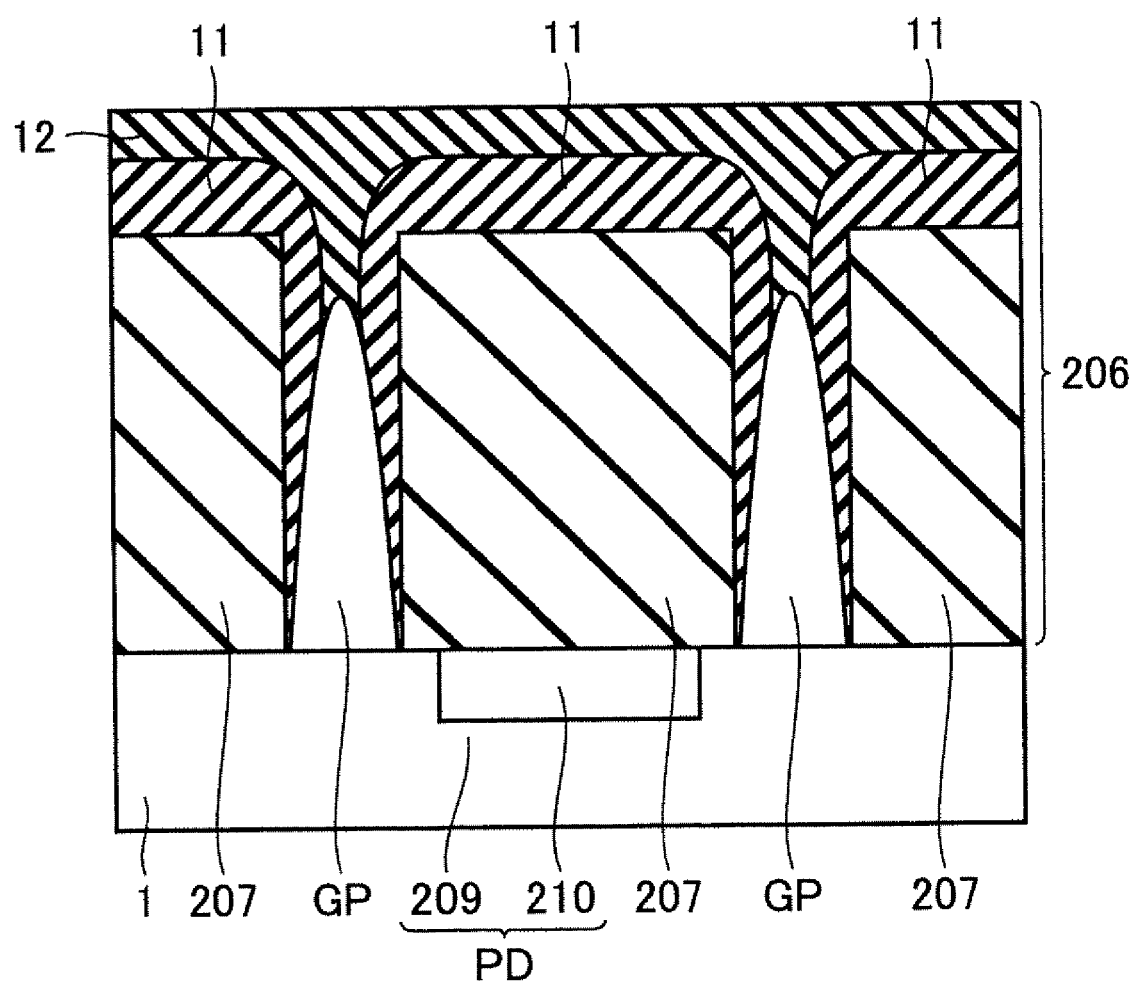
FIG. 17 is an outline cross-sectional view showing the fourth step of the manufacturing method of the semiconductor device in Embodiment 3 of the present invention.

With reference to FIG. 17, second insulating film 12 is formed so that this cavity may be occluded. This film formation is made into the conditions which are easier to do horizontal direction growth than the film formation conditions of first insulating film 11. As film formation conditions for this second insulating film 12, the same conditions as Embodiment 1 can be used.

Sputtering redeposition processing explained in Embodiment 2 before film formation of second insulating film 12 may be carried out according to need, and second insulating film 12 may be formed on the same conditions as the film formation conditions of Embodiment 2.

With reference to FIG. 13, after this, flattening of the upper surface of second insulating film 12 is done by CMP, and let it be CMP polished surface 208.

With reference to FIG. 12, the repeat structure of wiring layer 204 and second interlayer insulating layer 205 is formed in the upper surface of CMP polished surface 208, color filter 203 is formed in the upper surface, flattening layer 202 is formed in the upper surface, and micro lens 201 is formed in the upper surface. Semiconductor device 200 provided with the image sensor by the above is manufactured.

According to the semiconductor device of this embodiment, the problem of the corrosion by the CMP process performed after second insulating film 12 is formed is suppressed like Embodiment 1 mentioned above. Hereby, a reliable semiconductor device is obtained.

According to the semiconductor device of this embodiment, the side surface of each insulating film 207 is covered with first insulating film 11 with big width as it is an upside. Hereby, the effective euphotic area in the height for a top end of cavity GP becomes larger than the real area of photo diode PD. Therefore, more light is led to photo diode PD, and the sensitivity and the S/N ratio of an image sensor can be improved.

It should be thought that each embodiment disclosed this time is exemplification at points, and not restrictive. The range of the present invention is shown by not the above-mentioned explanation but the claim. It is meant that all the change in a meaning and within the limits equivalent to the claim is included.

The present invention may be applied especially in favor of the semiconductor device which has a cavity, and its manufacturing method.

What is claimed is:

1. A semiconductor device, comprising:
a semiconductor substrate which has a main front surface;
a plurality of convex patterns formed over a main front surface of the semiconductor substrate each including a floating gate and a control gate;
a first insulating film formed so that an upper surface and a side surface of each of the convex patterns is covered, and a width of a portion of the first insulating film which covers a lower part side surface of the convex pattern is smaller than a width of a portion of the first insulating film which covers an upper part side surface; and
a second insulating film that covers an upper surface and a side surface of the first insulating film so that a cavity between adjacent convex patterns is occluded, wherein
a position of the cavity occluded by the second insulating film is higher than an upper surface of the floating gate and lower than an upper surface of the control gate.

2. A semiconductor device according to claim 1, wherein a gap between the adjacent convex pattern is 200 nm or less.

3. A semiconductor device according to claim 1, wherein an aspect ratio of a trench formed between the adjacent convex patterns is five or more.

4. A method of manufacturing a semiconductor device, comprising the steps of:
forming a plurality of convex patterns over a main front surface of a semiconductor substrate;
forming a first insulating film that includes a silicon oxide film on first film formation conditions so that a width of a portion of the first insulating film which covers a lower part side surface of the convex pattern is smaller than a width of a portion of the first insulating film which covers an upper part side surface, and a side surface of each of the convex patterns is covered; and
forming a second insulating film over an upper surface and a side surface of the first insulating film on second film formation conditions that allow horizontal direction growth greater than the first film formation conditions so that a cavity between the adjacent convex patterns is occluded.

5. A method of manufacturing a semiconductor device according to claim 4, wherein
the first film formation conditions are conditions using a High-Density-Plasma Chemical Vapor Deposition Method performed without applying a bias voltage of RF to a substrate stage for laying the semiconductor substrate; and
the second film formation conditions are conditions using a Plasma Chemical Vapor Deposition Method.

6. A method of manufacturing a semiconductor device according to claim 4, wherein
the first film formation conditions are conditions using a High-Density-Plasma Chemical Vapor Deposition Method performed without applying a bias voltage of RF to a substrate stage for laying the semiconductor substrate; and
the second film formation conditions are conditions using a Sub Atmospheric Chemical Vapor Deposition Method.

7. A method of manufacturing a semiconductor device according to claim 4, wherein
the first film formation conditions are conditions using a Plasma Chemical Vapor Deposition Method; and
the second film formation conditions are conditions using a High-Density-Plasma Chemical Vapor Deposition Method performed by applying a bias voltage of RF to a substrate stage for laying the semiconductor substrate.

8. A method of manufacturing a semiconductor device according to claim 4, wherein
the first and the second film formation conditions are conditions using a Plasma Chemical Vapor Deposition Method.

9. A method of manufacturing a semiconductor device according to claim 4, wherein
the first film formation conditions are conditions using a Plasma Chemical Vapor Deposition Method; and
the second film formation conditions are conditions using a Sub Atmospheric Chemical Vapor Deposition Method.

10. A method of manufacturing a semiconductor device, comprising the steps of:
forming a plurality of convex patterns over a main front surface of a semiconductor substrate so that an aspect ratio of a trench formed between the adjacent convex patterns is five or more;
forming a first insulating film on first film formation conditions so that a width of a portion of the first insulating film which covers a lower part side surface of the convex pattern is smaller than a width of a portion of the first insulating film which covers an upper part side surface, and a side surface of each of the convex patterns is covered; and forming a second insulating film over an upper surface and a side surface of the first insulating film on second film formation conditions that allow horizontal direction growth greater than the first film formation conditions so that a cavity between the adjacent convex patterns is occluded.

11. A method of manufacturing a semiconductor device, comprising the steps of:

forming a plurality of convex patterns over a main front surface of a semiconductor substrate so that the each convex pattern includes a floating gate and a control gate;

forming a first insulating film on first film formation conditions so that a width of a portion of the first insulating film which covers a lower part side surface of the convex pattern is smaller than a width of a portion of the first insulating film which covers an upper part side surface, and a side surface of each of the convex patterns is covered; and forming a second insulating film over an upper surface and a side surface of the first insulating film on second film formation conditions that allow horizontal direction growth greater than the first film formation conditions so that a cavity between the adjacent convex patterns is occluded.

12. A method of manufacturing a semiconductor device, comprising the steps of:

forming a plurality of convex patterns over a main front surface of a semiconductor substrate;

forming a first insulating film on first film formation conditions so that a width of a portion of the first insulating film which covers a lower part side surface of the convex pattern is smaller than a width of a portion of the first insulating film which covers an upper part side surface, and a side surface of each of the convex patterns is covered;

doing redeposition to a side wall lower part of the first insulating film while doing sputtering of a side wall upper part of the first insulating film; and forming a second insulating film over an upper surface and a side surface of the first insulating film on second film formation conditions so that a cavity between the adjacent convex patterns is occluded.

13. A method of manufacturing a semiconductor device according to claim 12, wherein the first film formation conditions are conditions using a Plasma Chemical Vapor Deposition Method; and the second film formation conditions are conditions using a High-Density-Plasma Chemical Vapor Deposition Method performed by applying a bias voltage of RF to a substrate stage for laying the semiconductor substrate.

14. A method of manufacturing a semiconductor device according to claim 12, wherein the first film formation conditions are conditions using a Plasma Chemical Vapor Deposition Method; and the second film formation conditions are conditions using a High-Density-Plasma Chemical Vapor Deposition Method performed without applying a bias voltage of RF to a substrate stage for laying the semiconductor substrate.

15. A method of manufacturing a semiconductor device according to claim 12, wherein the first and the second film formation conditions are conditions using a Plasma Chemical Vapor Deposition Method.

16. A method of manufacturing a semiconductor device according to claim 12, wherein the first film formation conditions are conditions using a Plasma Chemical Vapor Deposition Method; and the second film formation conditions are conditions using a Sub Atmospheric Chemical Vapor Deposition Method.

17. A method of manufacturing a semiconductor device according to claim 12, wherein the sputtering is performed using a high-density-plasma chemical vapor deposition apparatus.

\* \* \* \* \*